United States Patent [19]
Tong

[11] Patent Number: 6,087,207
[45] Date of Patent: Jul. 11, 2000

[54] METHOD OF MAKING PSEUDOMORPHIC HIGH ELECTRON MOBILITY TRANSISTORS

[75] Inventor: Elsa K. Tong, Wayland, Mass.

[73] Assignee: Raytheon Company, Lexington, Mass.

[21] Appl. No.: 09/163,124

[22] Filed: Sep. 29, 1998

[51] Int. Cl.[7] .................... H01L 21/338; H01L 29/812
[52] U.S. Cl. .......................... 438/172; 438/167
[58] Field of Search .................. 438/167, 172, 438/DIG. 933, DIG. 970; 257/11, 12, 183, 188, 189, 192, 194, 200, 201, 617

[56] References Cited

U.S. PATENT DOCUMENTS

| | | | |
|---|---|---|---|
| 5,212,704 | 5/1993 | Chen et al. | 372/46 |
| 5,240,869 | 8/1993 | Nakatani | 438/167 |
| 5,324,682 | 6/1994 | Tserng | 438/172 |
| 5,352,909 | 10/1994 | Hori | 257/76 |
| 5,362,677 | 11/1994 | Sakamoto et al. | 438/167 |
| 5,364,816 | 11/1994 | Boos et al. | 438/172 |
| 5,389,574 | 2/1995 | Mizunuma | 438/167 |
| 5,445,979 | 8/1995 | Hirano | 438/167 |
| 5,504,353 | 4/1996 | Kuzuhara | 257/194 |
| 5,739,558 | 4/1998 | Ishida et al. | 257/192 |
| 5,789,767 | 8/1998 | Omura | 257/194 |
| 5,858,824 | 6/1999 | Saitoh | 438/167 |
| 5,949,095 | 9/1999 | Nagahara et al. | 257/192 |

FOREIGN PATENT DOCUMENTS

| | | | |
|---|---|---|---|
| 6-196504 | 7/1994 | Japan | 21/338 |
| 7-142685 | 6/1995 | Japan | 27/95 |
| 7-202173 | 8/1995 | Japan | 29/778 |
| 8-340012 | 12/1996 | Japan | 21/338 |
| WO 99/27586 | 6/1999 | WIPO | 29/812 |

*Primary Examiner*—Charles Bowers
*Assistant Examiner*—Evan Pert
*Attorney, Agent, or Firm*—Fish & Richardson P.C.

[57] ABSTRACT

A method for forming a gate of a field effect transistor wherein a structure is provided having: a gallium arsenide substrate; an indium gallium arsenide channel layer over the substrate; a doped aluminum gallium arsenide barrier layer over the channel layer; a gallium arsenide protective layer disposed on the donor layer; an indium gallium phosphide etch stop layer disposed over the protective layer; and a gallium arsenide source and drain contact layer disposed over the etch stop layer. A mask is provided over the surface of the structure to expose a surface portion of the contact layer. The exposed surface portion of the contact layer is subjected to a first etch and etching through the contact layer to expose an underlying surface portion of the etch stop layer. The first etch etches the contact layer at a substantially greater etch rate than the etch rate of such etch to the etch stop layer. The exposed surface portion of the etch stop layer is then subjected to a second etch and etching through the etch stop layer to expose an underlying surface portion of the protective layer. The second etch etches the etch stop layer at a substantially greater etch rate than the etch rate of such second etch to the protective layer. A gate metal is deposited over the mask and through etched portions of the etch stop layer onto, and in Schottky contact with the exposed portion of the protective layer. The method allows the formation of a gate recess by selective wet etching thereby eliminating surface damage associated with a dry etch and ungated recess. Because of the wet etching selectivity measurement of the channel current is eliminated to determine the etching end point.

24 Claims, 7 Drawing Sheets

METHOD OF MAKING PSEUDOMORPHIC HIGH ELECTRON MOBILITY TRANSISTORS

BACKGROUND OF THE INVENTION

This invention relates generally to pseudomorphic high electron mobility transistors (PHEMTs) and more particularly to transistors of such type which are formed on III–V substrates.

As is known in the art, there are several types of active devices used at microwave and millimeter frequencies to provide amplification of radio frequency signals. In general, one of the more common semiconductor devices used at these frequencies is the field effect transistor, in particular, metal electrode semiconductor field effect transistors (MESFETs), high electron mobility transistors (HEMTs), and pseudomorphic high electron mobility transistors (PHEMTs). Each of these transistors is formed from Group III–V materials such as gallium arsenide (GaAs) or indium phosphide (InP). What distinguishes a HEMT from a MESFET is that in a HEMT there is a doped barrier, or donor, layer of one material and an undoped channel layer of a different material. A heterojunction is formed between the doped donor layer and the undoped channel layer. This heterojunction provides spatial separation of electrons which are injected from the doped donor layer into the undoped channel layer. Thus, electrons from the large bandgap donor layer are transferred into the narrow bandgap channel layer where they are confined to move only in a plane parallel to the heterojunction. This results in the formation of a two-dimensional electron so-called "gas". Because conduction takes place in the undoped channel, impurity scattering is reduced in this undoped layer and electron mobility is thereby enhanced compared to the doped channel structure used in MESFETs. Accordingly, HEMTs provide higher frequency operation than MESFETs.

As is also known in the art, one type of PHEMT includes a gallium arsenide substrate having formed thereon successive layers of: an undoped InGaAs channel layer; a doped barrier (donor) AlGaAs layer; and n– GaAs and n+ GaAs ohmic contact layers, as shown in FIG. 1A. A layer of photoresist is then deposited over the structure and patterned to have an aperture over a portion of the structure to expose a region where the gate electrode is to be formed. Using the patterned photoresist as an etching mask, an etch is brought into contact with the portions exposed by the aperture to successively etch through portions of the n+ GaAs and n– GaAs layers and partially into the AlGaAs layer, as shown in FIG. 1A for a wet etch and FIG. 1B for a dry etch. In either case, a relatively wide recess is formed in the n+ GaAs and n– GaAs ohmic contact layers thereby improving the breakdown voltage of the FET. The dry etch has better selectivity and less undercut than a wet etch; however, the dry etch always causes some damage on the surface layer being etched which may induce more unwanted surface states. In either the wet or dry etch process, after the wide recess is formed, the photoresist is stripped and another layer of photoresist is deposited over the structure and patterned to define the narrow gate recess and gate metalization (i.e., the gate electrode) in Schottky contact with the AlGaAs channel layer as shown in FIG. 1C (when the wet etch is used to form the wide recess), or in FIG. 1D (when the dry etch is used to form the wide recess). In either case, for the AlGaAs PHEMT shown in either FIG. 1C or 1D, this narrow recess is performed with a wet chemical etch by a timed etch which is checked by measuring the open channel current between the source S and drain D electrodes. A gate metal is then deposited over the photoresist and through the electron beam patterned aperture formed therein onto the exposed portion of the aluminum gallium arsenide layer. After the photoresist layer and extraneous metal thereon are lifted-off, the gate electrode G is formed. The resulting FET is shown in FIG. 1E for the wet etch process and FIG. 1F for the dry etch process. If, on the other hand, instead of using the AlGaAs layer, a layer of InGaP was used, the use of the second photoresist layer on an InGaP surface and the use of a wet etch are not compatible. More particularly, the wet etch used for etching InGaP are solutions containing strong acids. These strong acids cause sever undercutting in the photoresist resulting in a complete loss of the InGaP surface layer. Further, it is noted from FIGS. 1E and 1F, that there is a significant portion of the recess which is ungated, designated by U in the figures, which results from either of these processes.

SUMMARY OF THE INVENTION

In accordance with the present invention, a method for forming a gate of a field effect transistor is provided. The method includes providing a structure having: a III–V substrate; a channel layer over the substrate; a doped barrier layer over the channel layer; a protective layer disposed on the donor layer; an etch stop layer disposed over the protective layer; and source and drain contact layer disposed over the etch stop layer. A mask is provided over the surface of the structure to expose a surface portion of the contact layer. The exposed surface portion of the contact layer is exposed to a first etch which etches through the contact layer to expose an underlying surface portion of the etch stop layer. The first etch etches the contact layer at a substantially greater etch rate than the etch rate of such etch to the etch stop layer. The exposed surface portion of the etch stop layer is exposed to a second etch which etches through the etch stop layer to expose an underlying surface portion of the protective layer. The second etch etches the etch stop layer at a substantially greater etch rate than the etch rate of such second etch to the protective layer. A metal is deposited over the mask and through etched portions of the etch stop layer onto the exposed portion of the protective layer.

With such a method, the gate recess is formed by selective wet etching. Thus, no dry etch is used and therefore there is no dry etching induced damage. Further, because of the selectivity of the etching, there is no need to measure the channel current to determine the etch end point resulting in better uniformity, better reproducibility and a less labor intensive process.

In accordance with another aspect of the invention, a method for forming a gate of a field effect transistor is provided. The method includes providing a structure having: a III–V substrate; a channel layer over the substrate; a doped barrier layer over the channel layer; a protective layer disposed on the donor layer; an etch stop layer disposed over the protective layer; and source and drain contact layer disposed over the etch stop layer. A mask is provided over the surface of the structure, such mask having an aperture therein to expose a surface portion of the contact layer. The exposed surface portion of the contact layer is subjected to a first etch to etch through the contact layer to expose an underlying surface portion of the etch stop layer, such first etch etching the contact layer at a substantially greater etch rate than the etch rate of such etch to the etch stop layer. The aperture in the mask is enlarged. The exposed surface portion of the etch stop layer exposed by the enlarged aperture is subjected to a second etch to etch through the etch stop layer to expose an underlying surface portion of the protective layer, such second etch etching the etch stop layer at a substantially greater etch rate than the etch rate of such second etch to the protective layer. A metal is deposited over the mask and through etched portions of the etch stop layer onto the exposed portion of the protective layer.

With such method, a transistor with no ungated recess can be produced.

In accordance with another feature of the invention the substrate is gallium arsenide, the channel layer is indium gallium arsenide and the protective layer is a material different from the etch stop layer.

In accordance with another feature of the invention, the protective layer is the same material as the source and drain contact layer.

In accordance with another feature of the invention, the protective layer has a thickness in the order of 10 to 20 Angstroms.

In accordance with still another feature of the invention, the protective layer is a III–V material.

In accordance with another feature of the invention, the protective layer is gallium arsenide.

In accordance with another feature of the invention, the etch stop layer is indium gallium phosphide.

In accordance with another feature of the invention a field effect transistor is provided. The transistor includes: a III–V substrate; a channel layer over the substrate; a doped barrier layer over the channel layer; an additional layer disposed over the barrier layer, such additional layer having an aperture therein; source and drain contact layer disposed over the laterally spaced regions of the additional layer; and a gate electrode having side portions thereof disposed in the aperture, walls of such aperture being in contact with such side portions of the gate electrode.

With such an arrangement, there is no ungated recess area thereby eliminating most problems associated with ungated recesses (i.e., uncontrolled reverse breakdown voltage, transient effects such as gate and drain lag, and decreased extrinsic transconductance.

In accordance with still another feature of the invention, a field effect transistor is provided. The field effect transistor includes a gallium arsenide substrate. An indium gallium arsenide channel layer is disposed over the substrate. A doped, aluminum gallium arsenide barrier layer is disposed over the channel layer. A protective layer is disposed on the barrier layer. An indium gallium phosphide layer is disposed over the protective layer, such indium gallium phosphide layer having an aperture therein. A source and drain contact layer is disposed over the laterally spaced regions of the indium gallium phosphide layer, the aperture being disposed between the laterally spaced regions of the indium gallium phosphide layer. A gate electrode is provided having side portions thereof disposed in the aperture in the indium gallium phosphide layer, walls of such aperture in the indium gallium phosphide layer being in contact with such side portions of the gate electrode and a bottom portion of such gate being in Schottky contact with the gallium arsenide layer.

BRIEF DESCRIPTION OF THE DRAWING

These and other features of the invention will become more readily apparent from the following detailed description when taken together with the accompanying drawings, in which.

DESCRIPTION OF THE PREFERRED EMBODIMENTS

Figure 1A:
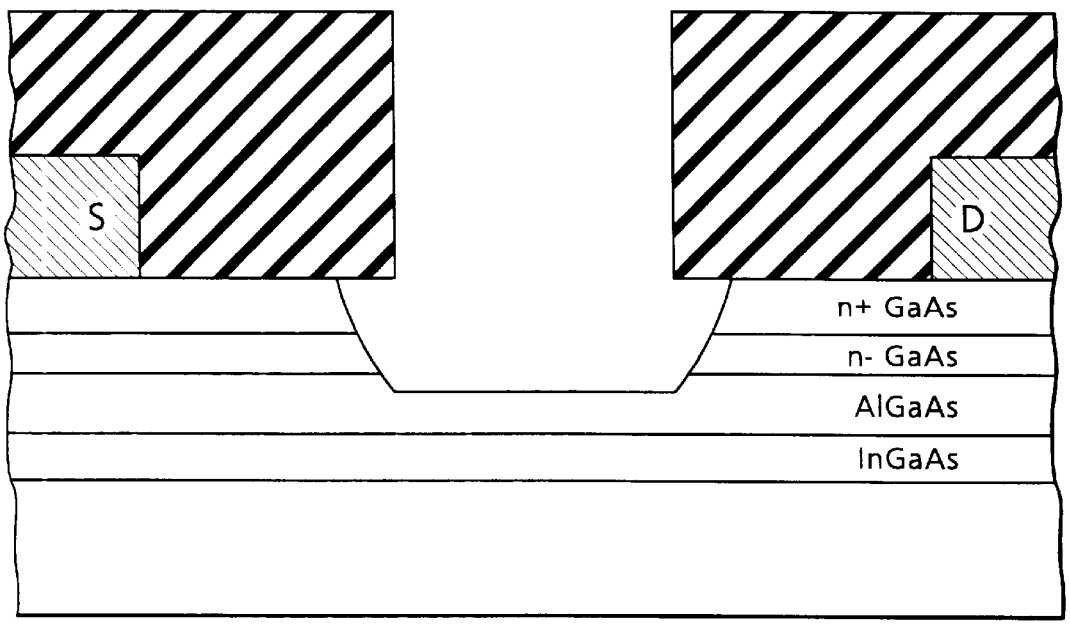
FIGS. 1A through 1F are diagrammatical sketches of a FET at various stages in the fabrication thereof in accordance with the PRIOR ART.
Figure 1B:
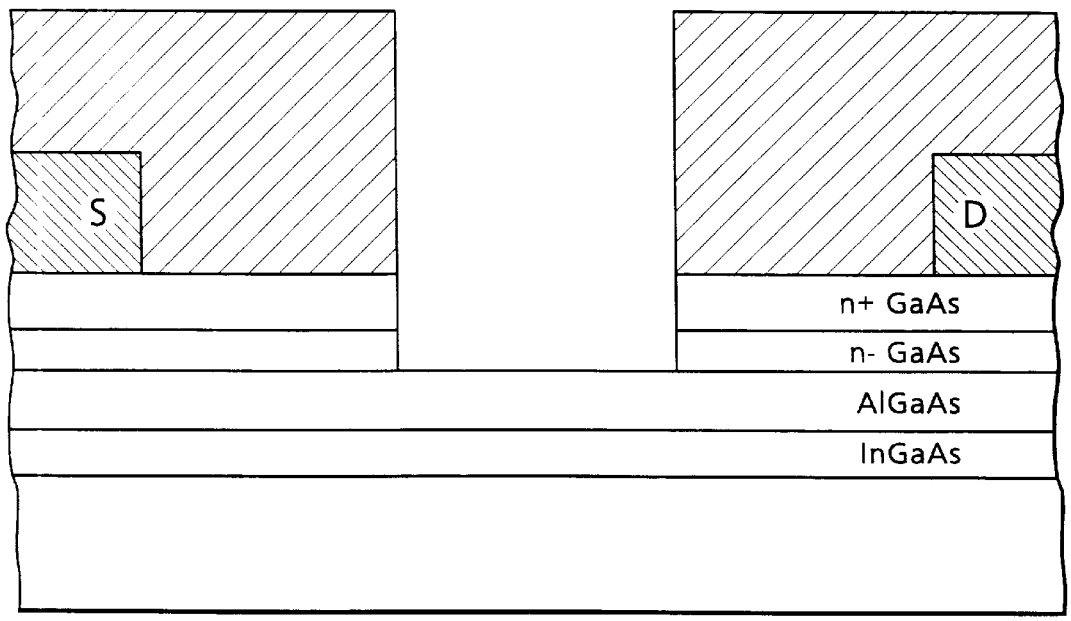
Figure 1C:
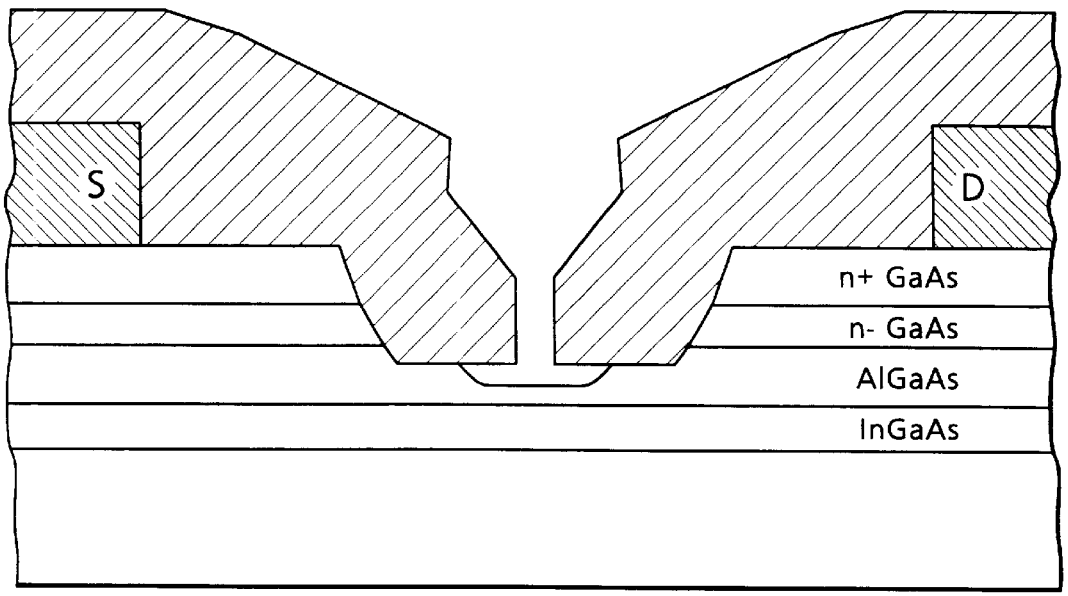
Figure 1D:
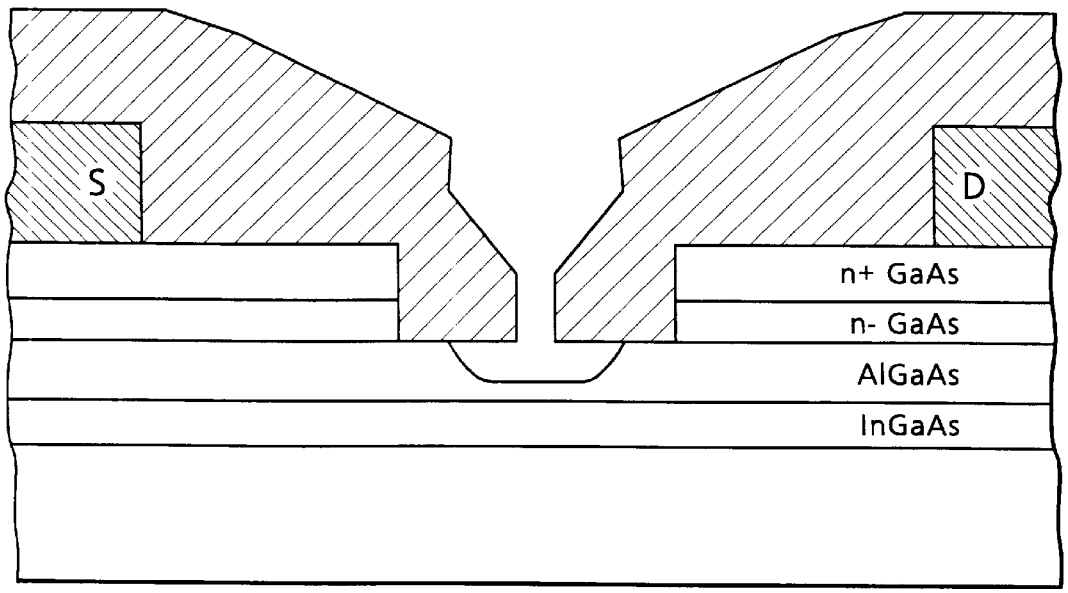
Figure 1E:
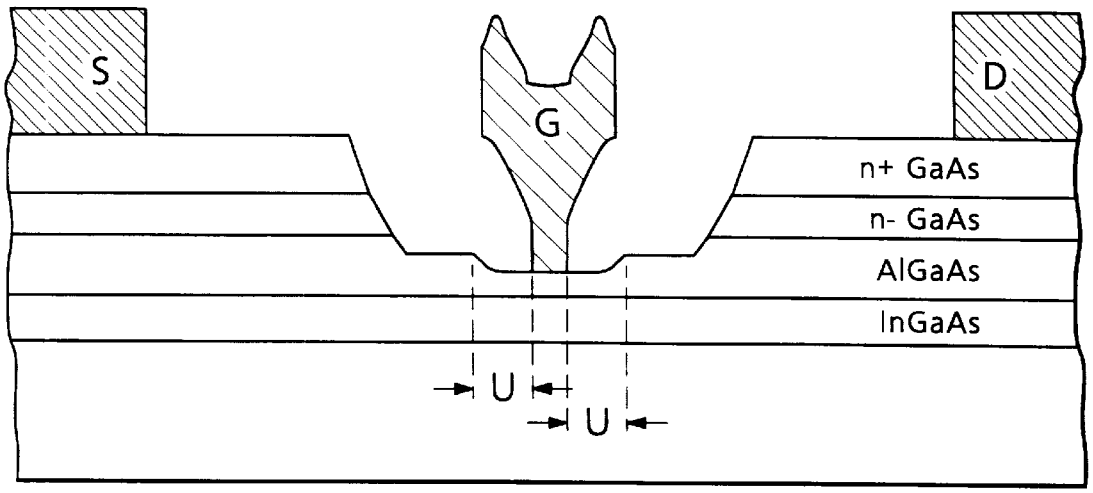
Figure 1F:
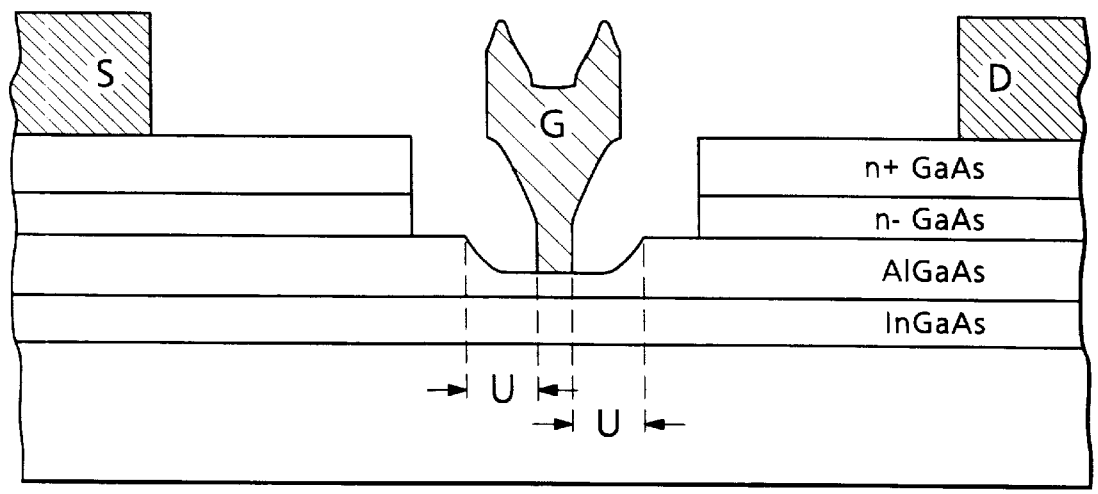
Figure 2:
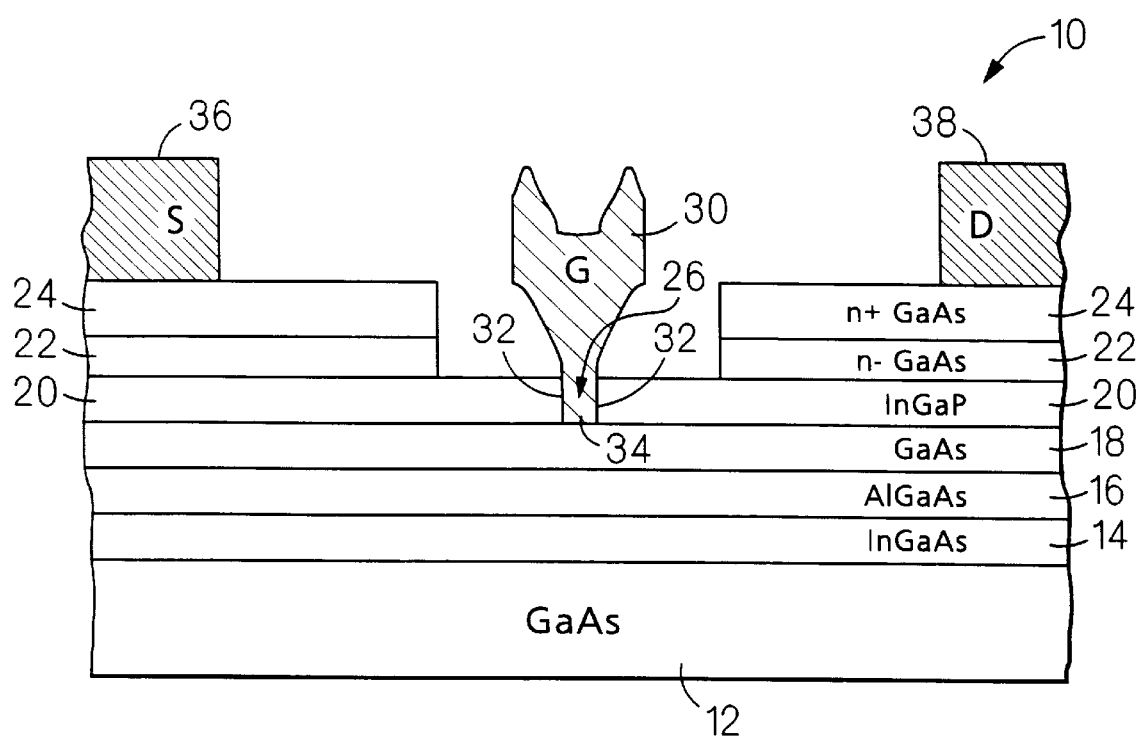
FIG. 2 is a diagrammatical sketch of a cross-section of a field effect transistor according to the invention.

Referring now to FIG. 2, a field effect transistor 10, here a PHEMT, is shown to include a gallium arsenide (GaAs) substrate 12, an indium gallium arsenide (InGaAs) channel layer 14 over the substrate 12, a doped, aluminum gallium arsenide (AlGaAs) barrier (donor) layer 16 over the channel layer 14, a protective layer 18 disposed on the barrier layer 16, an indium gallium phosphide (InGaP) layer 20 disposed over the protective layer, gallium arsenide (GaAs) source and drain contact layers 22, 24 disposed over the laterally spaced regions of the indium gallium phosphide layer 20. The indium gallium phosphide layer 20 has an aperture 26 therein. A gate G electrode 30 is provided having side portions thereof disposed in the aperture 26 in the indium gallium phosphide layer 20. The sidewalls 32 of such aperture 26 in the indium gallium phosphide layer 20 are in contact with such side portions of the gate electrode 30 and a bottom portion 34 of such gate electrode 30 is in Schottky contact with the gallium arsenide layer 18. Source S and drain D electrodes 36, 38, respectively, are in ohmic contact with the gallium arsenide layer 24, as shown. The protective layer 18 here has a thickness in the order of 10 to 20 Angstroms and a doping concentration of less than $5 \times 10^{17}$ $cm^{-3}$.

Here the indium gallium arsenide (InGaAs) channel layer 14 has a thickness of 100 to 200 Å and an electronic sheet concentration of $1 \times 10^{12}$ $cm^{-2}$ to $3 \times 10^{12}$ $cm^{-2}$. Here, the doped, aluminum gallium arsenide (AlGaAs) barrier (donor) layer 16 has a thickness of 100 to 300 Å and an electronic sheet concentration of $2 \times 10^{12}$ $cm^{-2}$ to $5 \times 10^{12}$ $cm^{-2}$. Here, the indium gallium phosphide (InGaP) layer 20 has a thickness of 100 to 300 Å and a doping concentration of less than $5 \times 10^{17}$ $cm^{-3}$. Here, the gallium arsenide (GaAs) source and drain contact layer 22 has a thickness of less than 400 Å and has a doping concentration of less than $5 \times 10^{17}$ $cm^{-3}$. Here, the contact layer 24 has a thickness of 400 to 600 Å and doping concentration of $2 \times 10^{18}$ $cm^{-3}$ to $6 \times 10^{18}$ $cm^{-3}$.

Referring now to FIGS. 3A–3E, the method of fabricating such a field effect transistor 10 (FIG. 2) will now be described. Thus, referring to FIG. 3A, a structure 100 is provided having: the gallium arsenide substrate 12; the indium gallium arsenide channel layer 14 over the substrate 12; the doped aluminum gallium arsenide barrier (donor) layer 16 over the channel layer 14; the gallium arsenide protective layer 18 disposed on the donor layer 16; the indium gallium phosphide layer 20, here an etch stop layer, disposed over the protective layer 18; gallium arsenide source and drain contact layers 22, 24 disposed over the etch stop layer 20; and the source S and drain D contacts 36, 38, respectively, as shown.

Next, a mask, here a layer 40 of photoresist patterned by an electron beam, not shown, with an aperture 42 having the shape shown is formed over the surface of the structure 100. The aperture 42 exposes a surface portion of the contact layer 24. The aperture 42 in the masking layer 40 has a width W, here 0.15 to 0.25 micrometers.

Next, a wet chemical solution is brought into contact with the patterned photoresist layer 40, a portion of such wet chemical passing through the aperture 42 onto the exposed surface portion of layer 24. The wet chemical is used to selectively etch the exposed portions of the gallium arsenide source and drain contact layers 22, 24. The etch rate of such chemical to gallium arsenide is at least two orders of magnitude greater than the etch rate of such chemical to indium gallium phosphide. Thus, the indium gallium phosphide layer 20 acts as an etch stop layer to the wet chemical. Here, for example, the wet chemical can be a mixture of citric acid, hydrogen peroxide, and water, or a mixture of sulfuric acid, hydrogen peroxide and water, or a mixture of ammonium hydroxide, hydrogen peroxide and water. For example, for the mixture of ammonium hydroxide, hydrogen peroxide and water, the ratios are 1 $NH_4OH$–1 $H_2O_2$–250 $H_2O$.

Next, an oxygen plasma is used to remove a thin layer from the photoresist layer. The purpose of this is to widen the photoresist layer 40 aperture 42 from width W to larger width W' so that the resist layer 40' (FIG. 3B) has an aperture 42' which is larger than, or equal to, the recess which became formed in the gallium arsenide layers 22, 24 due to undercutting of the photoresist layer 40 (FIG. 3A) by the wet chemical etch. This removal of a thin layer of the photoresist layer 40 will eliminate any ungated recess area when the gate metal, to be described, is deposited because the gate G electrode bottom region is defined by the aperture in the gallium arsenide layers 22, 24 and not by the aperture 42' in the photoresist layer 40'.

Next, the mask formed by the photoresist layer 40' and the etched gallium arsenide layers 22, 24 is brought into contact with a concentrated hydrochloric acid solution. The solution has a substantially lower (i.e., at least two orders of magnitude lower) etch rate to gallium arsenide than to the indium gallium phosphide. Thus, the aperture 26 (FIGS. 2 and 3B) is formed in the indium gallium phosphide layer 20 which is aligned with the aperture 42' previously formed in the photoresist layer 40' and in the underlying portions of the etched gallium arsenide layers 22, 24. Thus, the gallium arsenide protective layer 18 acts as an etch stop layer to the hydrochloric acid. In other words, the hydrochloric acid etch is selective; i.e., it only removes the indium gallium phosphide and leaves the gallium arsenide layer 18 intact. Thus, there is no need to monitor the current between the source and drain contacts 36, 38, as described above in connection with FIGS. 1A–1F, to determine the etch end point. In etching of the indium gallium phosphide layer 20, the masking material is, as noted above, now the gallium arsenide layers 22, 24 that was epitaxially grown on top of the indium gallium phosphide layer 20 and not the photoresist layer 40'. Thus, there is absolutely no undercutting of the indium gallium phosphide layer 20 even when a 100% over etch time is used, i.e., even when the etch time is exceeded by 100%.

Figure 3A:
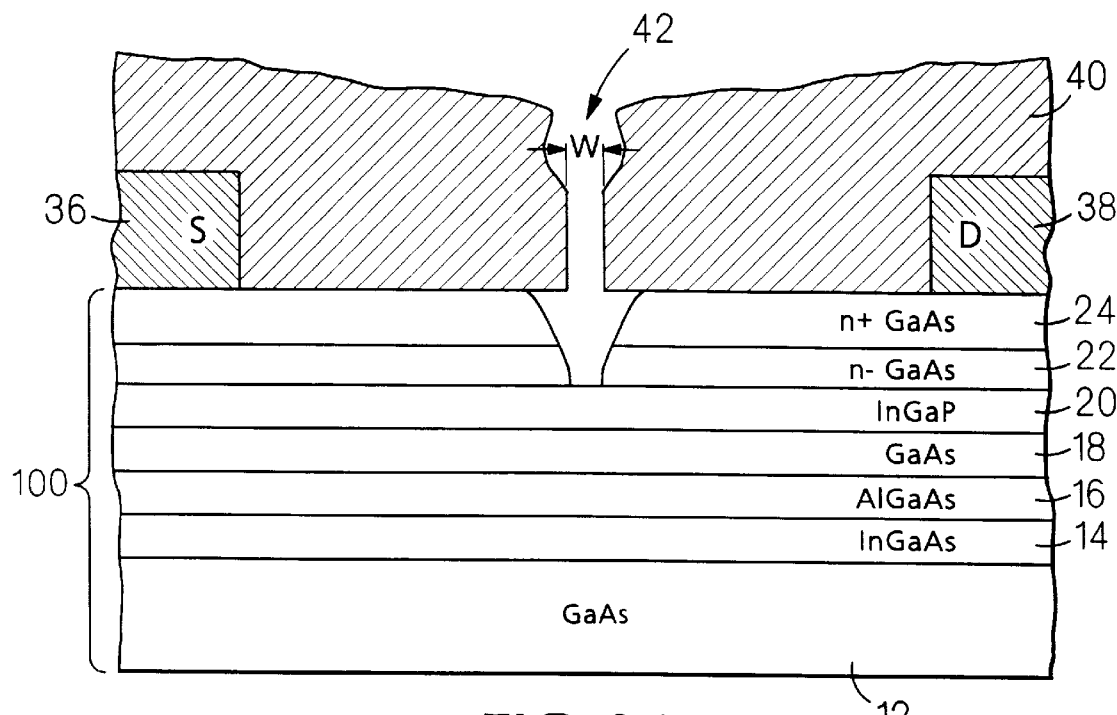
FIGS 3A through 3E are diagrammatical sketches of a cross-section of a field effect transistor of FIG. 2 at various stages in the fabrication thereof according to the invention.
Figure 3B:
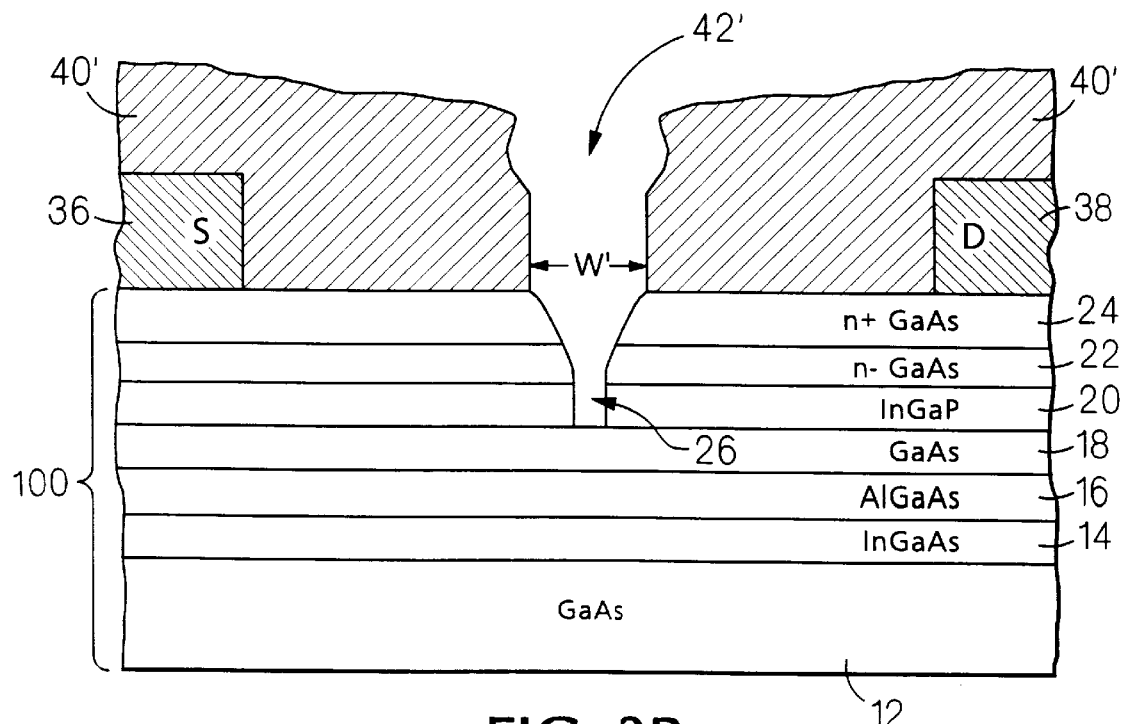
Figure 3C:
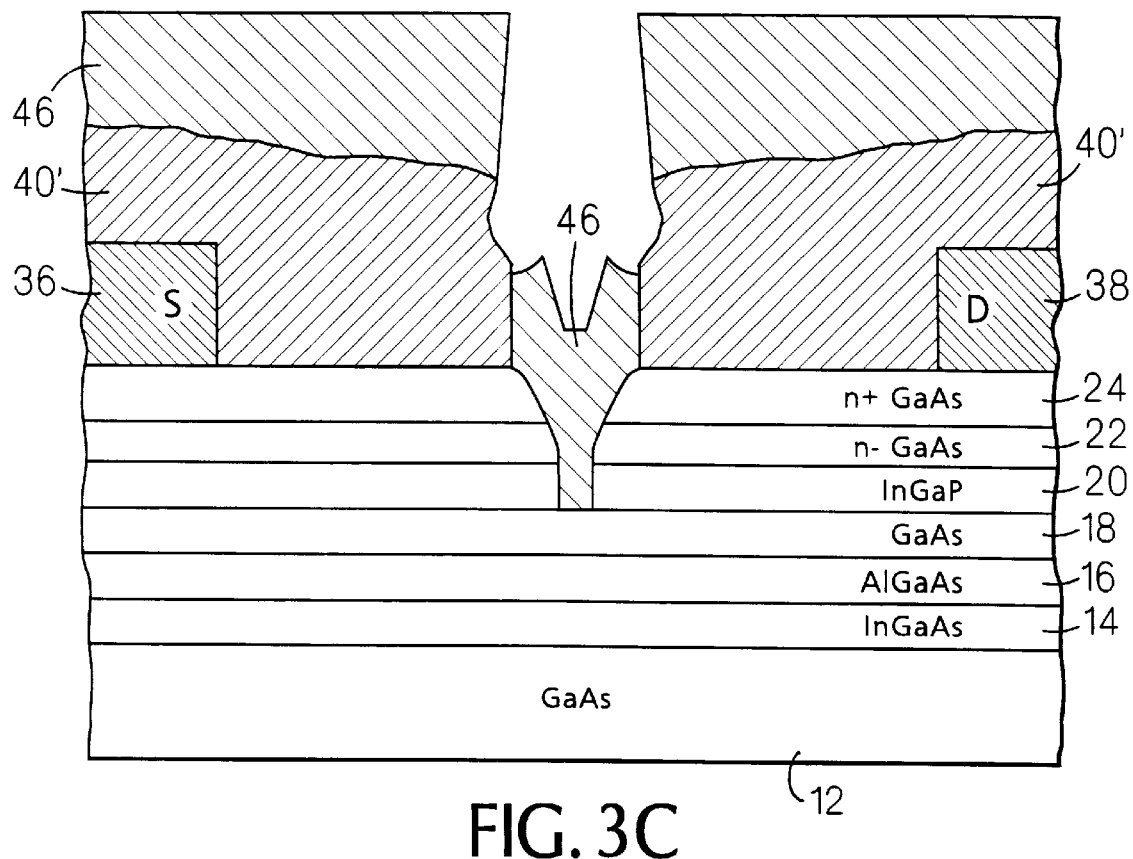
Figure 3D:
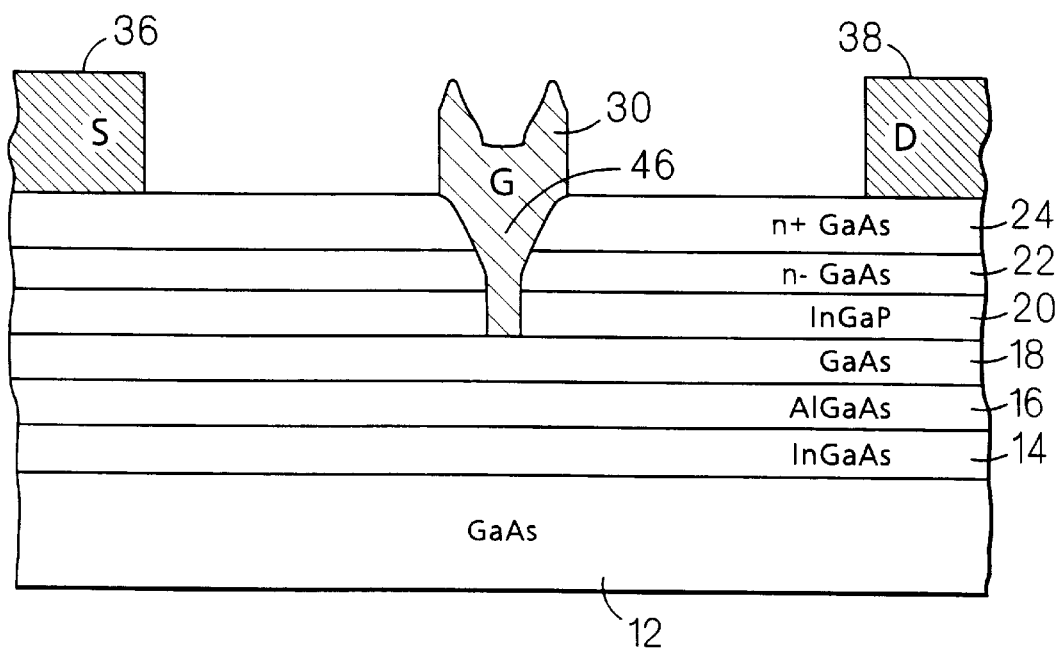
Figure 3E:
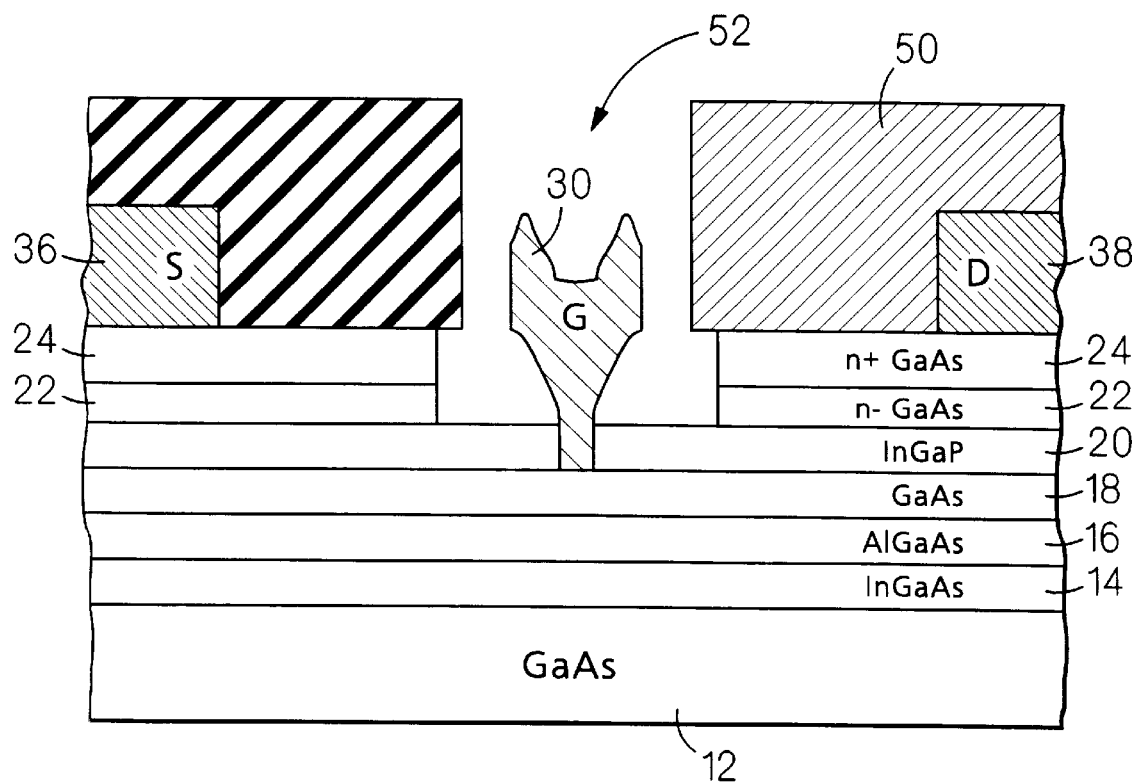

Next, referring to FIG. 3C, a gate metal 46, here titanium/platinum/gold, is deposited over the photoresist layer 40' and through the apertures 42' formed in the photoresist layer 40', the gallium arsenide layers 22, 24 and the aperture 26 (FIG. 3B) in the indium gallium phosphide layer 20, as shown. It is noted that the gate metal 46 fills the aperture 26 in layer 20 because the width W (FIG. 3A) of layer 40 had been widened to width W' (FIG. 3B). The photoresist layer 40' is then lifted-off removing the extraneous portions of the gate metal deposited thereon, to thereby form the gate G electrode 30, as shown in FIG. 3D. It is noted that the gate metal 46 is now touching the high doped gallium arsenide source and drain contact layers 22, 24 and would short circuit the transistor 10. Thus, referring to FIG. 3E, here a photoresist layer 50 is deposited over the surface of the structure shown in FIG. 3E and patterned as shown. More particularly, the photoresist layer 50 is patterned with a wider aperture 52 between the source and drain electrodes 36, 38 than the aperture 42, 42' (FIGS. 3A and 3B) formed in the photoresist layer 40, 40' shown. It is noted that the gate metal 46 forming the gate electrode 30 is in this wider aperture 52. Next, a wet etch, here a mixture of sulfuric acid, hydrogen peroxide and water or a mixture of ammonium hydroxide, hydrogen peroxide and water is brought into contact with the photoresist layer 50, the exposed gate metal 30, and the exposed surface portions of the gallium arsenide source and drain contact layers 22, 24 to remove, selectively, the exposed portions of such gallium arsenide contact layers 22, 24 while leaving substantially unetched the indium gallium phosphide etch stop layer 20. The photoresist layer 50 is then removed and the resulting field effect transistor 10 is shown in FIG. 2.

It is noted that the method described above in connection with FIGS. 3A–3E allows the formation of a gate recess by selective wet etching. Therefore, with such method, no damage to the structure from a dry etch results. Further, because of the wet etching selectivity, which is nearly infinite, there is no need, as mentioned above, to measure the channel current between the source and drain to determine the etching end point. Thus, the method yields greater uniformity, better reproducibility and is less labor intensive. Further, there is no ungated recess area thereby eliminating most significant problems associated with ungated recesses, i.e., uncontrolled reverse breakdown voltage, transient effects such as gate and drain lag, and decreased extrinsic transconductance.

Other embodiments are within the spirit and scope of the appended claims.

What is claimed is:

1. A method for forming a gate of a field effect transistor, comprising:
    (a) providing a structure having:
        a III–V substrate;
        a channel layer over the substrate;
        a doped barrier layer over the channel layer;
        a protective layer disposed on the barrier layer;
        an etch stop layer disposed over the protective layer; and
        a source and drain contact layer disposed over the etch stop layer;
    (b) providing a mask over the surface of the structure to expose a surface portion of the contact layer;
    (c) subjecting the exposed surface portion of the contact layer to a first etch and etching through the contact layer to expose an underlying surface portion of the etch stop layer, such first etch etching the contact layer at a greater etch rate than the etch rate of such etch to the etch stop layer;
    (d) subjecting the exposed surface portion of the etch stop layer to a second etch and etching through the etch stop layer to expose an underlying surface portion of the protective layer, such second etch etching the etch stop layer at a greater etch rate than the etch rate of such second etch to the protective layer; and
    (e) depositing a metal over the mask and through etched portions of the etch stop layer onto the exposed portion of the protective layer.

2. A method for forming a gate of a field effect transistor, comprising:
    (a) providing a structure having:
        a gallium arsenide substrate;

an indium gallium arsenide channel layer over the substrate;
a doped aluminum gallium arsenide barrier layer over the channel layer;
a gallium arsenide protective layer disposed on the barrier layer;
an indium gallium phosphide etch stop layer disposed over the protective layer; and
a gallium arsenide source and drain contact layer disposed over the etch stop layer;

(b) providing a mask over the surface of the structure to expose a surface portion of the contact layer;

(c) subjecting the exposed surface portion of the contact layer to a first etch and etching through the contact layer to expose an underlying surface portion of the etch stop layer, such first etch etching the contact layer at a greater etch rate than the etch rate of such etch to the etch stop layer;

(d) subjecting the exposed surface portion of the etch stop layer to a second etch and etching through the etch stop layer to expose an underlying surface portion of the protective layer, such second etch etching the etch stop layer at a greater etch rate than the etch rate of such second etch to the protective layer; and (e) depositing gate metal over the mask and through etched portions of the etch stop layer onto, and in Schottky contact with the exposed portion of the protective layer, such gate metal providing the gate electrode.

3. The method recited in claim 1 wherein the first etch step comprises subjecting the exposed surface portion of the contact layer to the first etch and etching through the contact layer to expose an underlying surface portion of the etch stop layer, such first etch etching the contact layer at an etch rate at least two orders of magnitude greater than the etch rate of such etch to the etch stop layer.

4. A The method recited in claim 1 wherein the second etch step comprises etching the etch stop layer at a rate at least two orders of magnitude greater etch rate than the etch rate of such second etch to the protective layer.

5. A method for forming a gate of a field effect transistor, comprising:

(a) providing a structure having:
a III–V substrate;
a channel layer over the substrate;
a doped barrier layer over the channel layer;
a protective layer disposed on the barrier layer;
an etch stop layer disposed over the protective layer; and
a source and drain contact layer disposed over the etch stop layer;

(b) providing a mask over the surface of the structure, such mask having an aperture therein to expose a surface portion of the contact layer;

(c) subjecting the exposed surface portion of the contact layer to a first etch and etching through the contact layer to expose an underlying surface portion of the etch stop layer, such first etch etching the contact layer at a greater etch rate than the etch rate of such etch to the etch stop layer;

(d) enlarging the aperture in the mask;

(e) subjecting the surface portion of the etch stop layer exposed by the enlarged aperture to a second etch and etching through the etch stop layer to expose an underlying surface portion of the protective layer, such second etch etching the etch stop layer at a greater etch rate than the etch rate of such second etch to the protective layer; and (f) depositing a metal over the mask and through etched portions of the etch stop layer onto the exposed portion of the protective layer.

6. A method for forming a gate of a field effect transistor, comprising:

(a) providing a structure having:
a gallium arsenide substrate;
an indium gallium arsenide channel layer over the substrate;
a doped aluminum gallium arsenide barrier layer over the channel layer;
a gallium arsenide protective layer disposed on the donor layer;
an indium gallium phosphide etch stop layer disposed over the protective layer; and
a gallium arsenide source and drain contact layer disposed over the etch stop layer;

(b) providing a mask over the surface of the structure, such mask having an aperture therein to expose a surface portion of the contact layer;

(c) subjecting the exposed surface portion of the contact layer to a first etch and etching through the contact layer to expose an underlying surface portion of the etch stop layer, such first etch etching the contact layer at a greater etch rate than the etch rate of such etch to the etch stop layer;

(d) enlarging the aperture in the mask;

(e) subjecting the surface portion of the etch stop layer exposed by the enlarged aperture to a second etch and etching through the etch stop layer to expose an underlying surface portion of the protective layer, such second etch etching the etch stop layer at a greater etch rate than the etch rate of such second etch to the protective layer; and (f) depositing gate metal over the mask and through etched portions of the etch stop layer onto, and in Schottky contact with the exposed portion of the protective layer, such gate metal providing the gate electrode.

7. The method recited in claim 6 wherein the first etch step comprises subjecting the exposed surface portion of the contact layer to the first etch and etching through the contact layer to expose an underlying surface portion of the etch stop layer, such first etch etching the contact layer at an etch rate at least two orders of magnitude greater than the etch rate of such etch to the etch stop layer.

8. The method recited in claim 6 wherein the second etch step comprises etching the etch stop layer at a rate at least two orders of magnitude greater etch rate than the etch rate of such second etch to the protective layer.

9. A field effect transistor, comprising:

(a) a III–V substrate;
(b) a channel layer over the substrate;
(c) a doped barrier layer over the channel layer;
(d) a protective layer disposed on the barrier layer;
(e) an additional layer disposed over the protective layer, such additional layer having an aperture therein;
(f) source and drain contact layers disposed over the laterally spaced regions of the additional layer, the aperture being disposed between the laterally spaced regions of the additional layer;
(g) a gate electrode having side portions thereof disposed in the aperture, walls of such aperture being in contact with such side portions of the gate electrode and a bottom portion of such gate being in Schottky contact with the protective layer.

10. The transistor recited in claim 9 wherein the substrate is gallium arsenide.

11. The transistor recited in claim 10 wherein the channel layer is indium gallium arsenide.

12. The transistor recited in claim 9 wherein the protective layer is a material different from the additional layer.

13. The transistor recited in claim 12 wherein the protective layer is the same material as the source and drain contact layer.

14. The transistor recited in claim 13 wherein the protective layer has a thickness in the order of 10 to 20 Angstroms.

15. The transistor recited in claim 14 wherein the protective layer is a III–V material.

16. The transistor recited in claim 15 wherein the protective layer is gallium arsenide.

17. The transistor recited in claim 16 wherein the additional layer is indium gallium phosphide.

18. A field effect transistor, comprising:
(a) a gallium arsenide substrate;
(b) an indium gallium arsenide channel layer over the substrate;
(c) a doped, aluminum gallium arsenide barrier layer over the channel layer;
(d) a protective layer disposed on the barrier layer;
(e) an indium gallium phosphide layer disposed over the protective layer, such indium gallium phosphide layer having an aperture therein;
(f) source and drain contact layers disposed over the laterally spaced regions of the indium gallium phosphide layer, the aperture being disposed between the laterally spaced regions of the indium gallium phosphide layer; and
(g) a gate electrode having side portions thereof disposed in the aperture in the indium gallium phosphide layer, walls of such aperture in the indium gallium phosphide layer being in contact with such side portions of the gate electrode and a bottom portion of such gate being in Schottky contact with the gallium arsenide layer.

19. The transistor recited in claim 18 wherein the protective layer is a III–V material.

20. The transistor recited in claim 19 wherein the protective layer is gallium arsenide.

21. The method recited in claim 1 wherein the metal depositing includes depositing the metal on sidewalls of the contact layer and including a step of parting the deposited metal from the sidewalls of the contact layer.

22. The method recited in claim 2 wherein the metal depositing includes depositing the metal on sidewalls of the contact layer and including a step of parting the deposited metal from the sidewalls of the contact layer.

23. The method recited in claim 5 wherein the metal depositing includes depositing the metal on sidewalls of the contact layer and including a step of parting the deposited metal from the sidewalls of the contact layer.

24. The method recited in claim 6 wherein the metal depositing includes depositing the metal on sidewalls of the contact layer and including a step of parting the deposited metal from the sidewalls of the contact layer.

* * * * *

UNITED STATES PATENT AND TRADEMARK OFFICE
CERTIFICATE OF CORRECTION

PATENT NO. : 6,087,207
DATED : July 11, 2000
INVENTOR(S) : Elsa K. Tong

Page 1 of 1

It is certified that error appears in the above-identified patent and that said Letters Patent is hereby corrected as shown below:

Please add the following:

"This invention was made with Government support under Contract No. F30602-95-C-0253 awarded by the Department of the Air Force. The Government has certain rights in this invention."

Signed and Sealed this

Second Day of October, 2001

Attest:

*Attesting Officer*

NICHOLAS P. GODICI
*Acting Director of the United States Patent and Trademark Office*